United States Patent
Li et al.

(10) Patent No.: US 12,231,135 B1
(45) Date of Patent: Feb. 18, 2025

(54) METHOD AND APPARATUS FOR TUNING A SYNTHESIZER

(71) Applicant: Anokiwave, Inc., San Diego, CA (US)

(72) Inventors: Jun Li, San Diego, CA (US); Kartik Sridharan, San Diego, CA (US); Gaurav Menon, San Marcos, CA (US); Antonio Geremia, San Diego, CA (US); Scott Humphreys, Greensboro, NC (US); Akhil Garlapati, San Diego, CA (US); Shamsun Nahar, San Diego, CA (US); Kevin Greene, Somerville, MA (US)

(73) Assignee: Anokiwave, Inc., San Diego, CA (US)

( * ) Notice: Subject to any disclaimer, the term of this patent is extended or adjusted under 35 U.S.C. 154(b) by 0 days.

(21) Appl. No.: 18/102,331

(22) Filed: Jan. 27, 2023

Related U.S. Application Data (63) Continuation of application No. 17/110,806, filed on Dec. 3, 2020, now abandoned.

(60) Provisional application No. 62/942,894, filed on Dec. 3, 2019.

(51) Int. Cl.
| | |
|---|---|
| *H03L 7/18* | (2006.01) |
| *H03L 7/087* | (2006.01) |
| *H03L 7/10* | (2006.01) |
| *H03L 7/113* | (2006.01) |
| *H03L 7/23* | (2006.01) |

(52) U.S. Cl.
CPC ............. *H03L 7/18* (2013.01); *H03L 7/087* (2013.01); *H03L 7/103* (2013.01); *H03L 7/113* (2013.01); *H03L 7/23* (2013.01)

(58) Field of Classification Search
CPC ......... H03L 7/099; H03L 7/113; H03L 7/087; H03L 7/10; H03L 7/101; H03L 7/102; H03L 7/103
See application file for complete search history.

(56) References Cited

U.S. PATENT DOCUMENTS

2005/0219003 A1* 10/2005 Urakawa ............ H03L 7/099
                                                                    331/117 R
2016/0182065 A1* 6/2016 Wicpalek ............ H04L 7/033
                                                                    327/156

\* cited by examiner

*Primary Examiner* — Ryan Johnson
(74) *Attorney, Agent, or Firm* — Haynes and Boone, LLP (57) ABSTRACT

A method and/or apparatus for tuning a frequency synthesizer device toward a prescribed frequency may input a signal into the input of the frequency synthesizer to produce an output signal having an output frequency, select a first one of a set of the above noted prescribed coarse curves, and compare the magnitude of the difference between the prescribed frequency and the output frequency. Next, the method selects a second of the set of coarse curves as a function of the magnitude of the difference between the prescribed frequency and the output frequency. Preferably, the method selects the second of the set of coarse curves by selecting one or more of the coarse curves out of the sequential frequency order as a function of the magnitude of the difference between the prescribed frequency and the output frequency.

19 Claims, 9 Drawing Sheets

METHOD AND APPARATUS FOR TUNING A SYNTHESIZER

PRIORITY

This patent application is a continuation of U.S. patent application Ser. No. 17/110,806 entitled METHOD AND APPARATUS FOR TUNING A SYNTHESIZER filed Dec. 3, 2020, which claims the benefit of U.S. Provisional Patent Application No. 62/942,894 entitled METHOD AND APPARATUS FOR FAST COARSE TUNING IN SYNTHESIZERS filed Dec. 3, 2019, each of which is hereby incorporated herein by reference in its entirety.

FIELD OF THE INVENTION

Illustrative embodiments of the invention relate to phased arrays and, more particularly, the illustrative embodiments of the invention relate to phase lock loops and synthesizers used in phased arrays.

BACKGROUND OF THE INVENTION

Phased arrays used with modern systems, such as 5G systems, typically require its frequency synthesizer to settle rapidly for effective operation. Among other benefits, rapid frequency switching in the 5G context supports band switching and transmit/receive mode switching.

SUMMARY OF VARIOUS EMBODIMENTS

In accordance with one embodiment of the invention, an apparatus tunes a frequency synthesizer device, having an input and an output, toward a prescribed frequency. The apparatus has an interface configured to direct a signal to the input of the frequency synthesizer to produce an output signal having an output frequency, and memory for storing a set of prescribed coarse curves. The set of prescribed coarse curves preferably have a sequential frequency order. The apparatus further has a selector configured to select one of the set of prescribed coarse curves, and a comparator configured to compare the prescribed frequency and the output frequency to produce a magnitude value. Moreover, the selector also is configured to select a different coarse curve of the set of coarse curves as a function of the magnitude value. Additionally, the selector preferably is configured to select the different coarse curve by selecting one or more of the coarse curves out of the sequential frequency order.

The selector also may be configured to choose a final coarse curve of the set of coarse curves. In some instances, the apparatus also has a fine tuner configured to use information from final selected coarse curve, toward a fine signal having the prescribed frequency. Moreover, the interface may be configured to forward the signal into the input of the lock loop at a frequency that is a function of the first or second coarse curve.

The frequency synthesizer may have a switched capacitor bank with a plurality of switches. Each of the set of coarse curves may be associated with at least one of the plurality of switches (e.g., using a binary code or a four-bit word). Among other things, the frequency synthesizer may have one or more voltage controlled oscillators.

A counter may be configured to use the output signal to produce a plurality of phase shifted signals with the same frequencies. The counter also may be configured to count edges in the plurality of signals to determine the number of rising and falling edges in the output signal, and/or count one edge per period of each of the plurality of signals. Each of the plurality of signals has a lower frequency than the output frequency.

The second coarse curve may have a second frequency at a given voltage, and the difference between the second frequency and the prescribed frequency preferably is smaller than the difference between the prescribed frequency and the output frequency.

In accordance with another embodiment of the invention, a method of tuning a frequency synthesizer device toward a prescribed frequency may input a signal into the input of the frequency synthesizer to produce an output signal having an output frequency, select a first one of a set of the above noted prescribed coarse curves, and compare the magnitude of the difference between the prescribed frequency and the output frequency. Next, the method selects a second of the set of coarse curves as a function of the magnitude of the difference between the prescribed frequency and the output frequency. Preferably, the method selects the second of the set of coarse curves by selecting one or more of the coarse curves out of the sequential frequency order as a function of the magnitude of the difference between the prescribed frequency and the output frequency.

After selecting the first or other coarse curve, the method may adjust the frequency of the frequency synthesizer as a function of the first or other coarse curve. The method may determine the magnitude of the difference in any of a number of manners, such as by subtracting the prescribed frequency from the output frequency, or subtracting the output frequency from the prescribed frequency.

Illustrative embodiments of the invention are implemented as a computer program product having a computer usable medium with computer readable program code thereon. The computer readable code may be read and utilized by a computer system in accordance with conventional processes.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a phased array system more effectively and efficiently tunes its output signal to a prescribed frequency. To that end, the system first tunes its output frequency (e.g., during run-time or calibration of its frequency synthesizer) to a coarse frequency close to the desired frequency, and then to the desired frequency using conventional fine tuning processes. To coarse tune, the system compares the frequency of the synthesizer's output signal to the desired frequency, and then jumps to the appropriate coarse frequency signal more rapidly than known prior art techniques. Details of illustrative embodiments are discussed below.

Figure 1:
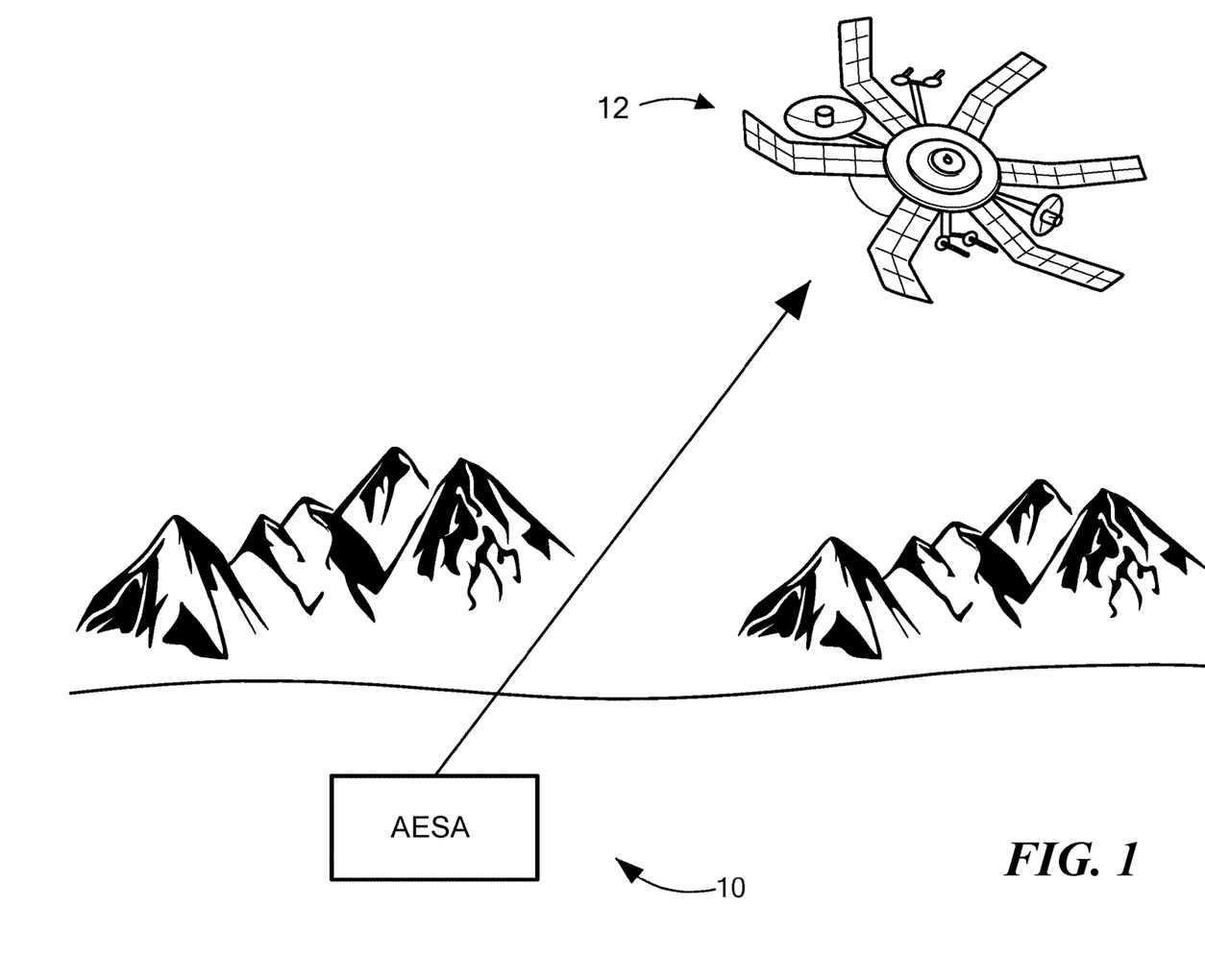
FIG. 1 schematically shows an active electronically steered element system ("AESA system") configured in accordance with illustrative embodiments of the invention and communicating with a satellite.

FIG. 1 schematically shows an active electronically steered antenna system ("AESA system 10") configured in accordance with illustrative embodiments of the invention and communicating with an orbiting satellite 12. Note that this system and the corresponding components discussed with regard to this application is illustrative. Various embodiments may apply to other systems and applications, such as for use with 5G base stations. Discussion of the system of FIG. 1 thus is not intended to limit various embodiments.

A phased array (discussed below and identified in FIG. 1 by reference number "10A") implements the primary functionality of the AESA system 10. Specifically, as known by those skilled in the art, the phased array forms one or more of a plurality of electronically steerable beams that can be used for a wide variety of applications. As a satellite communication system, for example, the AESA system 10 preferably is configured operate at one or more satellite frequencies. Among others, those frequencies may include the Ka-band, Ku-band, and/or X-band.

The satellite communication system may be part of a cellular network operating under a known cellular protocol, such as the 3G, 4G, or 5G protocols. Accordingly, in addition to communicating with satellites, the system may communicate with earth-bound devices, such as smartphones or other mobile devices, using any of the 3G, 4G, or 5G protocols. As another example, the satellite communication system may transmit/receive information between aircraft and air traffic control systems. Of course, those skilled in the art may use the AESA system 10 (implementing the noted phased array 10A) in a wide variety of other applications, such as broadcasting, optics, radar, etc. Some embodiments may be configured for non-satellite communications and instead communicate with other devices, such as smartphones (e.g., using 4G or 5G protocols). Accordingly, discussion of communication with orbiting satellites 12 is not intended to limit all embodiments of the invention.

Figure 2A:
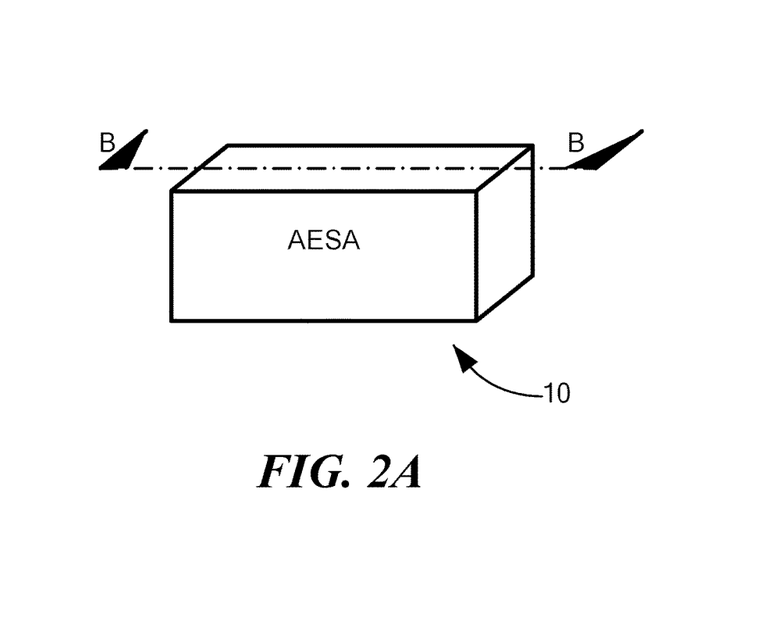
FIGS. 2A and 2B schematically show generalized diagrams of an AESA system that may be configured in accordance with illustrative embodiments of the invention.
Figure 2B:
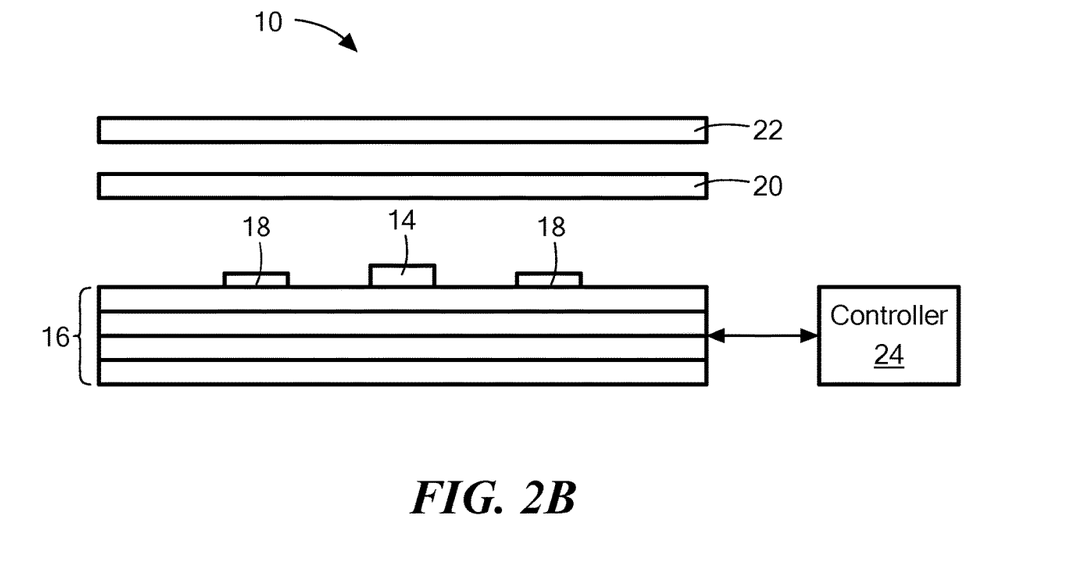

FIGS. 2A and 2B schematically show generalized diagrams of the AESA system 10 configured in accordance with illustrative embodiments of the invention. Specifically, FIG. 2A schematically shows a block diagram of the AESA system 10, while FIG. 2B schematically shows a cross-sectional view of a small portion of the same AESA system 10 across line B-B. This latter view shows a single silicon integrated circuit 14 mounted onto a substrate 16 between two transmit, receive, and/or dual transmit/receive elements 18, i.e., on the same side of a supporting substrate 16 and juxtaposed with the two elements 18. In alternative embodiments, however, the integrated circuit 14 could be on the other side/surface of the substrate 16A. The AESA system 10 also has a polarizer 20 to selectively filter signals to and from the phased array 10A, and a random 22 to environmentally protect the phased array of the system 10. A separate antenna controller 24 (FIG. 2B) electrically connects with the phased array to calculate beam steering vectors for the overall phased array, and to provide other control functions.

Figure 3A:
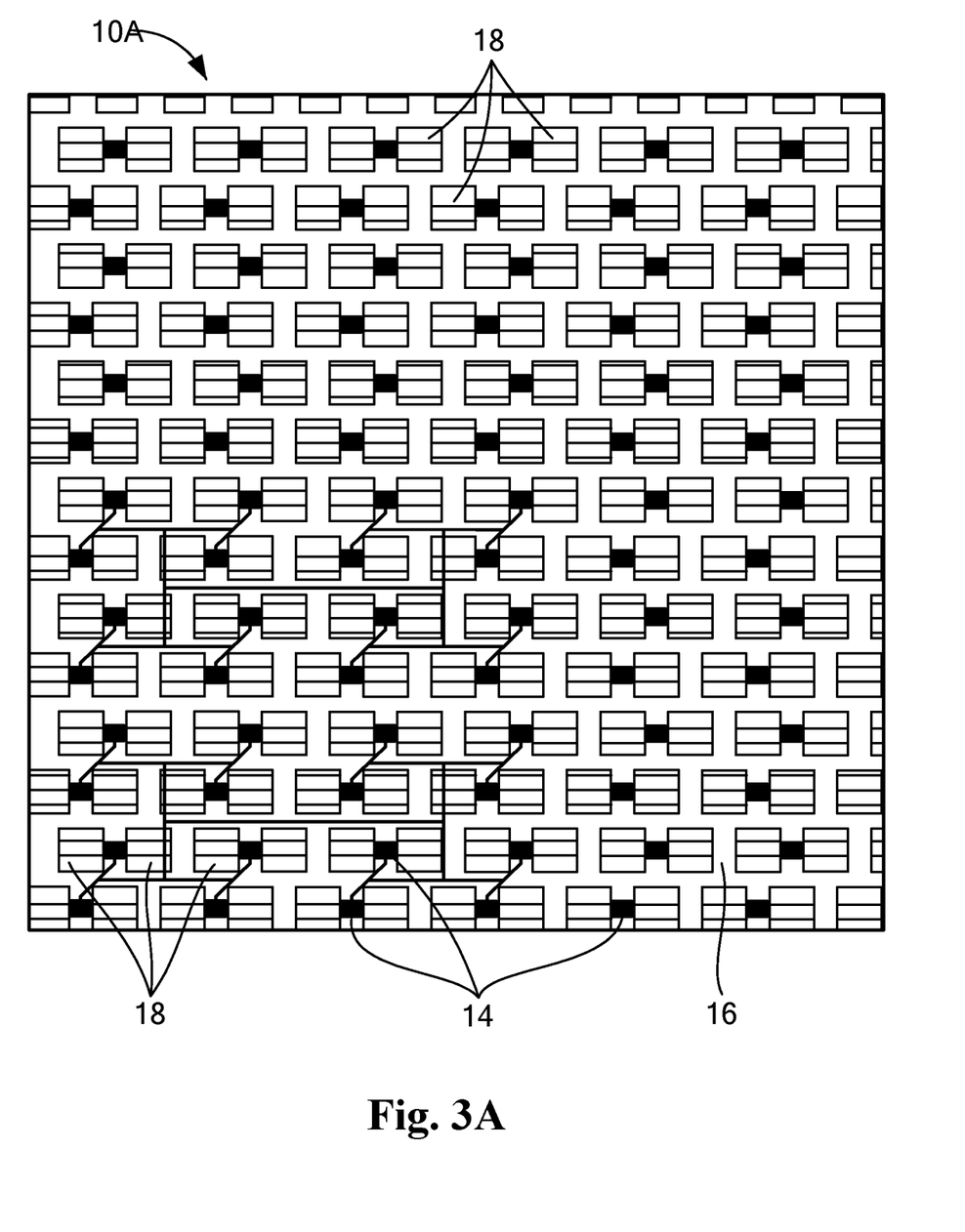
FIG. 3A schematically shows a plan view of a laminar printed circuit board portion of an AESA configured in accordance with illustrative embodiments of the invention.

FIG. 3A schematically shows a plan view of a primary portion of an AESA system 10 that may be configured in accordance with illustrative embodiments of the invention. In a similar manner, FIG. 3B schematically shows a close-up of a portion of the phased array 10A of FIG. 3A.

Specifically, the AESA system 10 of FIG. 3A is implemented as a laminar phased array 10A having a laminated printed circuit board 16 (i.e., acting as the substrate for routing signals and also identified by reference number "16") supporting the above noted plurality of elements 18 and integrated circuits 14. The elements 18 preferably are formed as a plurality of square or rectangular patch antennas oriented in a triangular patch array configuration. In other words, each element 18 forms a triangle with two other adjacent elements 18. When compared to a rectangular lattice configuration, this triangular lattice configuration requires fewer elements 18 (e.g., about 15 percent fewer in some implementations) for a given grating lobe free scan volume. Other embodiments, however, may use other lattice configurations, such as a pentagonal configuration or a hexagonal configuration. Moreover, despite requiring more elements 18, some embodiments may use a rectangular lattice configuration. Like other similar phased arrays, the printed circuit board 16 also may have a ground plane (not shown) that electrically and magnetically cooperates with the elements 18 to facilitate operation.

Figure 3B:
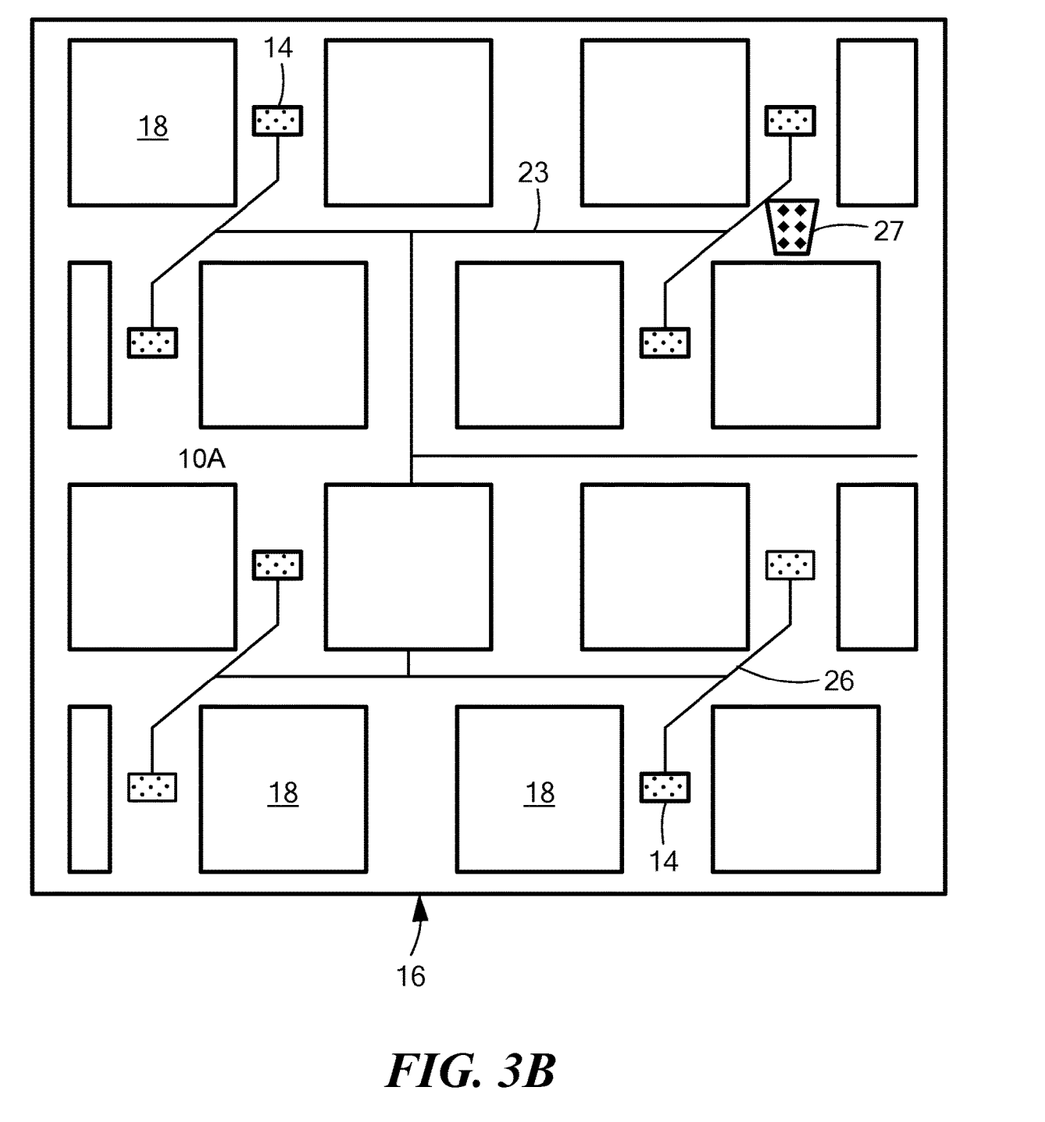
FIG. 3B schematically shows a close-up of a portion of the laminated printed circuit board of FIG. 3A.

Indeed, the array shown in FIGS. 3A and 3B is a small phased array 10A. Those skilled in the art can apply principles of illustrative embodiments to laminar phased arrays 10A with hundreds, or even thousands of elements 18 and integrated circuits 14. In a similar manner, those skilled in the art can apply various embodiments to smaller phased arrays 10A.

As a patch array, the elements 18 have a low profile. Specifically, as known by those skilled in the art, a patch antenna (i.e., the element 18 or the transmission/receiving part of the element) typically is mounted on a flat surface and includes a flat rectangular sheet of metal (known as the patch and noted above) mounted over a larger sheet of metal known as a "ground plane." A dielectric layer between the two metal regions electrically isolates the two sheets to prevent direct conduction. When energized, the patch and ground plane together produce a radiating electric field and/or receive RF signals.

As noted above and discussed in greater detail below, illustrative embodiments form the patch antennas on one or more printed circuit boards that themselves are coupled with the printed circuit board 16. These patent antennas preferably are formed using standard printed circuit board fabrication processes, thus complying with standard printed circuit board design rules (discussed below). Accordingly, using such fabrication processes, each element 18 in the phased array 10A should have a very low profile.

The phased array 10A can have one or more of any of a variety of different functional types of elements 18. For example, the phased array 10A can have transmit-only elements 18, receive-only elements 18, and/or dual mode receive and transmit elements 18 (referred to as "dual-mode elements 18"). The transmit-only elements 18 are configured to transmit outgoing signals (e.g., burst signals) only, while the receive-only elements 18 are configured to receive incoming signals only. In contrast, the dual-mode elements 18 are configured to either transmit outgoing burst signals, or receive incoming signals, depending on the mode of the phased array 10A at the time of the operation. Specifically, when using dual-mode elements 18, the phased array 10A can be in either a transmit mode, or a receive mode. The noted controller 24 at least in part controls the mode and operation of the phased array 10A, as well as other array functions.

The AESA system 10 has a plurality of the above noted integrated circuits 14 (mentioned above with regard to FIG. 2B) for controlling operation of the elements 18. Those skilled in the art often refer to these integrated circuits 14 as "beam steering integrated circuits," or "beam forming integrated circuits."

Each integrated circuit 14 preferably is configured with at least the minimum number of functions to accomplish the desired effect. Indeed, integrated circuits 14 for dual mode elements 18 are expected to have some different functionality than that of the integrated circuits 14 for the transmit-only elements 18 or receive-only elements 18. Accordingly, integrated circuits 14 for such non-dual-mode elements 18 typically have a smaller footprint than the integrated circuits 14 that control the dual-mode elements 18. Despite that, some or all types of integrated circuits 14 fabricated for the phased array 10A can be modified to have a smaller footprint.

As an example, depending on its role in the phased array 10A, each integrated circuit 14 may include some or all of the following functions:
  phase shifting,
  amplitude controlling/beam weighting,
  switching between transmit mode and receive mode,
  output amplification to amplify output signals to the elements 18,
  input amplification for received RF signals (e.g., signals received from the satellite 12), and
  power combining/summing and splitting between elements 18.

Indeed, some embodiments of the integrated circuits 14 may have additional or different functionality, although illustrative embodiments are expected to operate satisfactorily with the above noted functions. Those skilled in the art can configure the integrated circuits 14 in any of a wide variety of manners to perform those functions. For example, the input amplification may be performed by a low noise amplifier, the phase shifting may use conventional active phase shifters, and the switching functionality may be implemented using conventional transistor-based switches.

Each integrated circuit 14 preferably operates on at least one element 18 in the array. For example, one integrated circuit 14 can operate on two or four different elements 18. Of course, those skilled in the art can adjust the number of elements 18 sharing an integrated circuit 14 based upon the application. For example, a single integrated circuit 14 can control two elements 18, three elements 18, five elements 18, six elements 18, seven elements 18, eight elements 18, etc., or some range of elements 18. Sharing the integrated circuits 14 between multiple elements 18 in this manner reduces the required total number of integrated circuits 14, correspondingly reducing the required size of the printed circuit board 16.

As noted above, the dual-mode elements 18 may operate in a transmit mode, or a receive mode. To that end, the integrated circuits 14 may generate time division diplex or duplex waveforms so that a single aperture or phased array 10A can be used for both transmitting and receiving. In a similar manner, some embodiments may eliminate a commonly included transmit/receive switch in the side arms of the integrated circuit 14. Instead, such embodiments may duplex at the element 18. This process can be performed by isolating one of the elements 18 between transmit and receive by an orthogonal feed connection.

RF interconnect, through-vias, and/or beam forming lines 26 electrically connect the integrated circuits 14 to their respective elements 18. To further minimize the feed loss, illustrative embodiments mount the integrated circuits 14 as close to their respective elements 18 as possible. Specifically, this close proximity preferably reduces RF interconnect line lengths, reducing the feed loss. To that end, each integrated circuit 14 preferably is packaged either in a flip-chipped configuration using wafer level chip scale packaging (WLCSP), or a traditional package, such as quad flat no-leads package (QFN package). While other types of packaging may suffice, WLCSP techniques are preferred to minimize real estate on the substrate 16A. Some embodiments may mount some or all of the integrated circuits 14 on or within the printed circuit boards forming the elements 18. Other embodiments may mount some or all of the integrated circuits 14 on the underlying routing substrate board 16.

In addition to reducing feed loss, using WLCSP techniques reduces the overall footprint of the integrated circuits 14, enabling them to be mounted on the top face of the printed circuit board 16 with the elements 18—providing more surface area for the elements 18.

It should be reiterated that although FIGS. 3A and 3B show the AESA system 10 with some specificity (e.g., the layout of the elements 18 and integrated circuits 14), those skilled in the art may apply illustrative embodiments to other implementations. For example, as noted above, each integrated circuit 14 can connect to more or fewer elements 18, or the lattice configuration can be different. Accordingly, discussion of the specific configuration of the AESA system 10 of FIG. 3A (and other figures) is for convenience only and not intended to limit all embodiments.

Figure 4:
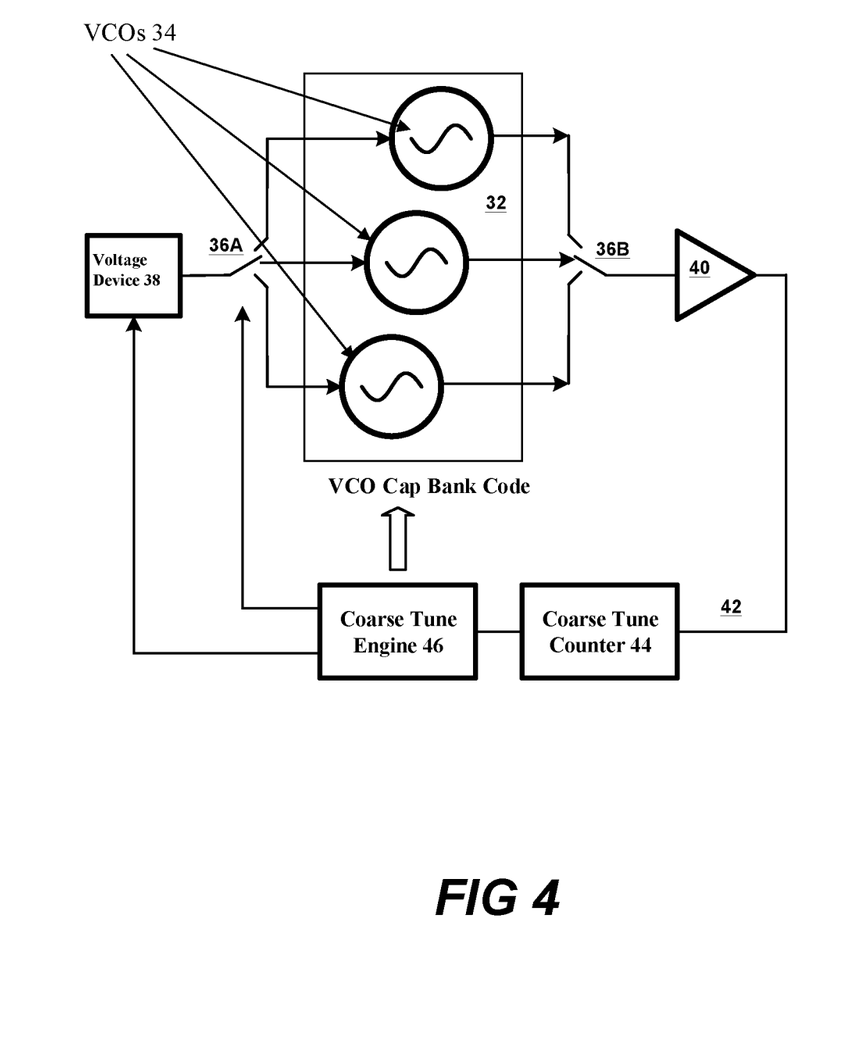
FIG. 4 schematically shows a VCO bank having three separate VCOs in illustrative embodiments of the invention.

Illustrative embodiments include a frequency synthesizer 32, such as phase lock loop (also identified by reference number "32"), implemented as a plurality of voltage controlled oscillators ("VCOs 34") that rapidly lock the phased arrays 10 at a prescribed frequency. These VCOs 34 preferably are implemented by the integrated circuits, although they may be separate from the integrated circuits. To that end, FIG. 4 schematically shows a bank of VCOs 34 having three separate VCOs 34. In illustrative embodiments, each VCO 34 is configured to lock to different and/or overlapping frequencies. For example, from the perspective of the drawing, the top VCO 34 may be configured to lock to lower frequencies, such as 0.1 to 4 GHz, the middle VCO 34 may be configured to lock to mid-range frequencies, such as 4-8 GHz, and the bottom VCO 34 may be configured to lock to higher frequencies, such as 8-15 GHz. Those skilled in the art may adjust those ranges and numbers of VCOs 34 depending on the application.

Accordingly, the VCO bank has an input switch 36A to connect one selected VCO 34 to an input voltage device 38 that applies a fixed voltage to one of the VCOs 34, and an output switch 36B that couples the output of the selected VCO 34 to an amplifier 40 and a feedback loop 42. The VCO 34 used thus depends on the desired frequency of the VCO output signal.

The feedback loop 42 couples with a coarse tune counter 44 that counts edges of the oscillating output signal of the selected VCO 34. Illustrative embodiments use this count to determine the frequency of the VCO output signal. The feedback loop 42 also has a coarse tune engine 46 that controls the output signal of the selected VCO 34 by 1) directing a prescribed code to the selected VCO 34 and 2) directing the input voltage device 38 to input a prescribed DC voltage, which may fluctuate to arrive at the appropriate VCO output signal frequency (discussed below). Each of these elements may be implemented as some processing component, such as hardware (e.g., digital signal processors), software/firmware, or a combination of hardware and software. Those skilled in the art can select the appropriate implementation to suit their application.

Preferably, during use, the coarse tune engine 46 selects one of the VCOs 34 as a function of the desired output frequency of the VCO bank. For example, the coarse tune engine 46 may select the bottom VCO 34 and set the switches 36A and 36B to connect that specific VCO 34 to the feedback loop 42. As discussed in more detail below, the coarse tune engine 46 then selects coarse input parameters to bring the output frequency of the selected VCO signal to a value close to the desired output frequency. This process is referred to below as "coarse tuning." Coarse tuning is a typical step during calibration or frequency/channel switching because of uncertainties with the precision and accuracy of the VCOs 34. Among other things, each VCO 34 may be designed within some tolerance range that can impede precise, one-step frequency setting.

After arriving at a reasonable coarse tune level, a fine tuner or other logic fine tunes the output signal to the desired output frequency (including some tolerance) using what is referred to in the art as "fine tuning." Details of these coarse and fine tuning processes are discussed below.

Figure 5:
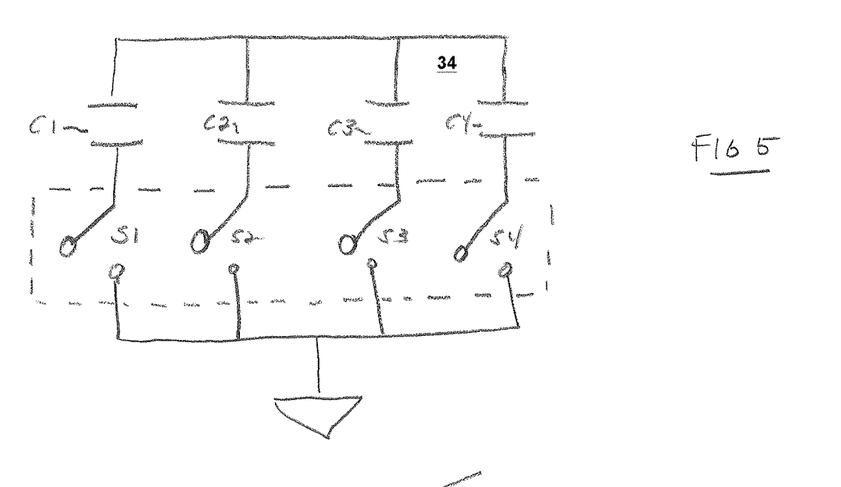
FIG. 5 schematically shows an example of a switch capacitor bank that may be used with illustrative embodiments of the invention.

To those ends, in illustrative embodiments, each VCO 34 has a bank of parallel switched capacitors (i.e., a capacitance or capacitor bank) that the coarse tune engine 46 controls to produce the signal with a coarse tune frequency. Specifically, FIG. 5 schematically shows an example of a switch capacitor bank with four capacitors C1-C4 and four corresponding switches S1-S4. The coarse tune engine 46 controls which switches are closed as a function of a 4-bit word it transmits to the VCO bank—i.e., the "VCO cap bank code" schematically shown in FIG. 4. A "0" in the word may signify an open switch while a "1" in the word may signify an closed switch. Thus, from the perspective of the figure, the word "1100" causes the two left switches S1 and S2 to close, while keeping the remaining switches S3 and S4 open. The combination of capacitors coupled with the circuit at a given time thus controls the output frequency of the VCO 34. Specifically, as discussed below, that frequency of the VCO output signal is dictated by a set of prescribed coarse curves organized in a sequential frequency order based on the word, frequency, or other parameter.

Figure 6:
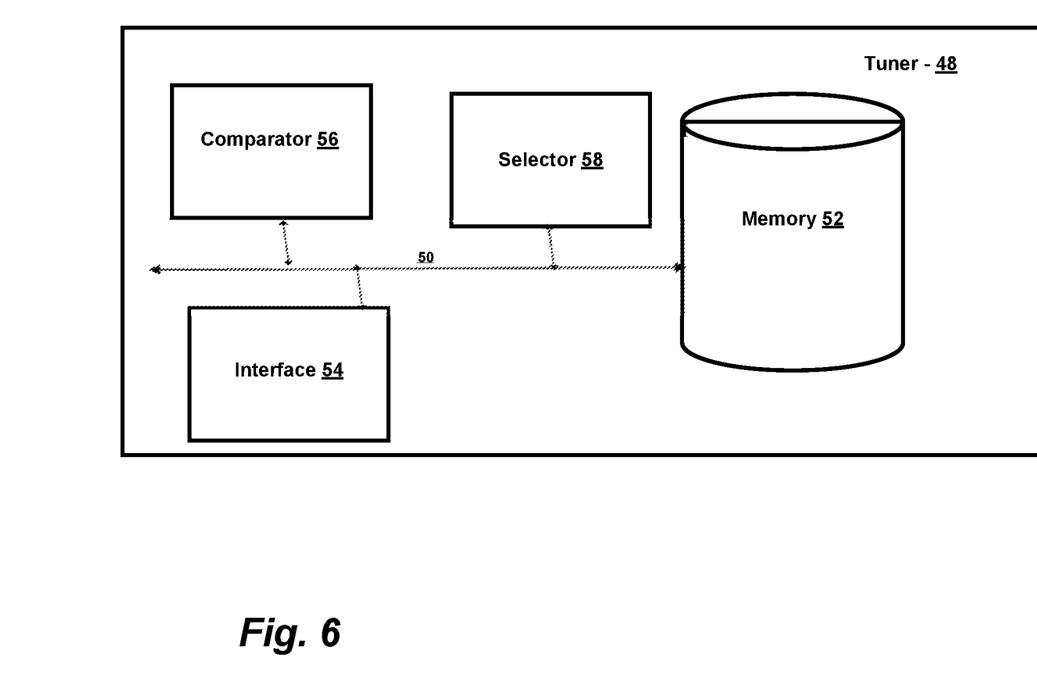
FIG. 6 schematically shows a tuner configured in accordance with illustrative embodiments of the invention.

Illustrative embodiments have an apparatus, such as a tuner 48, configured to control the output frequency so it can converge more rapidly on a prescribed, desired synthesizer output signal frequency. To that end, FIG. 6 schematically shows a tuner 48 configured in accordance with illustrative embodiments of the invention. Each of these components is operatively connected by any conventional interconnect mechanism. FIG. 6 simply shows a bus 50 communicating the components. Those skilled in the art should understand that this generalized representation can be modified to include other conventional direct or indirect connections. Accordingly, discussion of the bus 50 is not intended to limit various embodiments.

Indeed, it should be noted that FIG. 6 only schematically shows each of these components. Those skilled in the art should understand that each of these components can be implemented in a variety of conventional manners, such as by using hardware, software, or a combination of hardware and software, across one or more other functional components. For example, the selector 58 (discussed below) may be implemented using a plurality of microprocessors executing firmware. As another example, the selector 58 may be implemented using one or more application specific integrated circuits (i.e., "ASICs") and related software, or a combination of ASICs, discrete electronic components (e.g., transistors), and microprocessors. Accordingly, the representation of the selector 58 and other components in a single box of FIG. 6 is for simplicity purposes only. In fact, in some embodiments, the selector 58 may be distributed across a plurality of different machines—not necessarily within the same housing or chassis. Of course, the other components in the tuner 48 also can have implementations similar to those noted above for the selector 58.

It should be reiterated that the representation of FIG. 6 is a simplified representation. Those skilled in the art should understand that such a device likely has many other physical and functional components, such as central processing units, other packet processing modules, and short-term memory. Accordingly, this discussion is not intended to suggest that FIG. 6 represents all of the elements of various embodiments.

The tuner 48 may be implemented as a stand-alone component, as part of the coarse tune engine 46 and/or coarse tune counter 44, or in some other manner. As shown, the tuner 48 has memory 52 for storing process related information, such as the above noted and below described set of coarse curves, and an interface 54 for communicating with other components in the system (e.g., the coarse tune counter 44 and/or the VCOs 34). The tuner 48 also has a comparator 56 configured to analyze signals using comparisons (e.g., comparing frequencies either directly or through some function), and a selector 58 configured to select one of the noted set of coarse curves.

Figure 7:
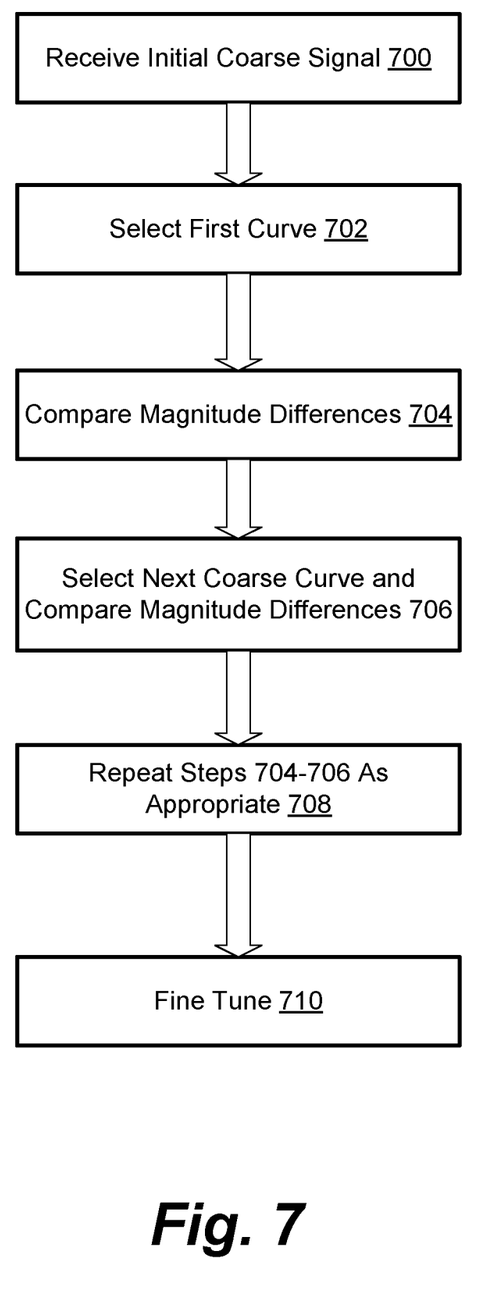
FIG. 7 shows a process of tuning a frequency of the synthesizer of FIG. 4 in accordance with illustrative embodiments.

FIG. 7 shows a process of tuning the output signal frequency of the synthesizer 32 of FIG. 4 in accordance with illustrative embodiments. It should be noted that this process is simplified from a longer process that normally would be used to tune the synthesizer 32. Accordingly, the process of tuning the synthesizer/phase lock 32 loop likely has many steps that those skilled in the art likely would use. In addition, some of the steps may be performed in a different order than that shown, or at the same time. Those skilled in the art therefore can modify the process as appropriate.

The process of FIG. 7 begins at step 700, in which the interface 54 receives an initial coarse signal of the set of coarse signals. Specifically, FIG. 8 graphically shows an exemplary set of these coarse curves-5 in total. Each curve is associated with one of 5 different values for a 4-bit word (i.e., 0000, 1000, 1100, 1110, and 1111). Note that the frequency of the output signal along any of these curves is a function of the voltage provided by the input voltage device 38.

Figure 8:
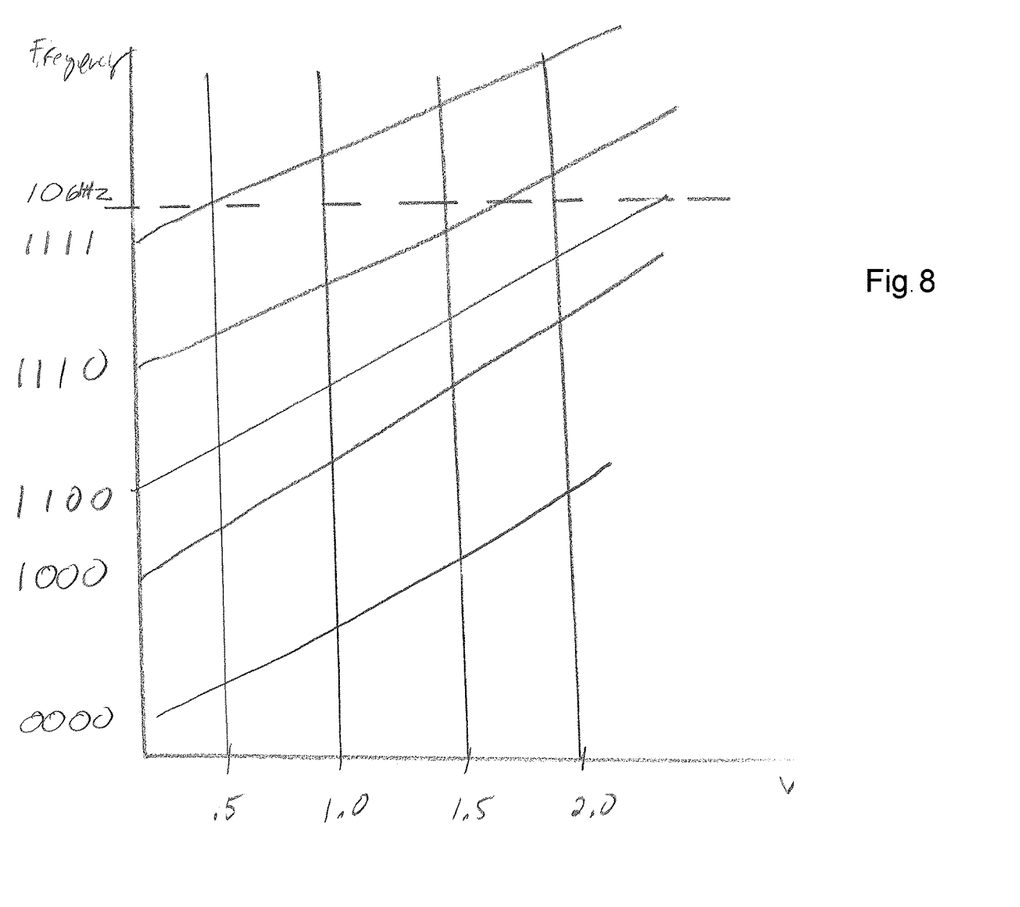
FIG. 8 shows an exemplary set of coarse curves to help describe various embodiments of the invention.

These coarse curves are considered to form a set of prescribed coarse curves having a "sequential frequency order." More specifically, for a given voltage (X-axis), each curve is used, by one or more other components, to produce a signal having a different output frequency. As shown on the Y-axis, for a plurality of fixed voltage at the input of the VCOs 34, these curves are in ascending frequency order from bottom to top (i.e., the frequency increases with each curve from bottom to top). For example, with an input voltage of 1.0 volts, the bottom curve produces the lowest frequency signal, the second curve from the bottom produces (i.e., is used to produce) the second-lowest frequency signal, etc. to the top curve, which produces the highest frequency signal. When starting from the bottom, these prescribed coarse curves thus are considered to have an order ranging from lowest frequency to highest frequency (or vice versa if starting from the top). This order is represented also by the four-bit word associated with each curve-curve 0000 has the lowest frequencies, while curve 1111 has the highest frequencies.

After selecting an appropriate VCO 34 (e.g., one the operates in the desired frequency range), the selector 58 selects a first of the coarse curves, which has an associated four-bit word (step 702). The coarse tune engine 46 then updates the selected VCO 34 with the four-bit code associated with that VCO 34, producing a new synthesizer/VCO output signal having a new frequency. The comparator 56 then compares the magnitude of the frequency of this new output signal (i.e., its frequency) to the desired output frequency (step 704).

As an example, FIG. 8 has a horizontal dashed line at 10 GHz to show the goal/desired/prescribed frequency. To that end, the coarse tune engine 46 begins the coarse tuning process with the goal of ultimately selecting one of the curves that is close to 10 GHz. Before iterating to one of the curves as an initial, intermediate, or final coarse curve, the input voltage device 38 sets the input voltage to a specific voltage. For example, input voltage device 38 may set the input voltage at 0.5 volts. As shown in the figure, the set voltage in this example can range from 0 to more than 2.0 volts. Setting the voltage in this manner fixes at least one point in the X-axis to help converge toward a desired coarse curve.

The system then starts a set of iterative passes with the 4-bit word to converge on 10 GHz. After each pass, the frequency of the output synthesizer signal preferably is closer to the desired frequency than the frequency of the prior output synthesizer signal. A first pass may start by setting the 4-bit word to 0000, which means all the switches S1-S4 are open (i.e., the initial coarse curve, selected as noted above). As shown in FIG. 8, this produces an VCO output signal having a frequency that is quite far from 10 GHz. After recognizing this, rather than next setting the first bit to 1, however, the coarse tune engine 46 may set more than one bit to 1 to aim closer to 10 GHz in these first steps (steps 702 and 704), or at later iterations. For example, the comparator 56 may compare the frequency of the initial VCO output signal to 10 GHz, and then use that comparison (e.g., the magnitude of that difference of the noted frequencies) to select the next bit(s) to enable or set to 1 (or 0).

As an example, the frequency of that initial VCO output signal may have a magnitude of 1.5 GHz. Thus, the magnitude of the difference between 1.5 GHz and 10 GHz is 8.5 GHz. Alternatively, those skilled in the art may compare another way—without necessarily relying exclusively on determining the magnitude of the difference—by another technique other than a straight subtraction of either from the other. For example, some embodiments may subtract the two and then use some other mathematical function to modify the difference (e.g., adding both frequencies to some formula that does incorporate a difference of the two frequencies). In either case, the comparison is a function of the difference between the two frequency values. Other embodiments may compare the two magnitudes/frequencies with other techniques.

In preparation for the next step, for the next iteration, the selector 58 thus next may set certain numbers of bits to 1 if the magnitude exceeds some maximum, a fewer number of bit(s) to 1 if the magnitude is some mid-level, or not change it at all. Those skilled in the art can select an appropriate algorithm and way to select the switches/bits to set.

As such, the process continues to step 706, which selects the next coarse curve based on the magnitude of the difference of the frequency of the current output signal and the desired frequency. As noted, this may involve skipping one or more of the coarse curves—i.e., selecting a next coarse curve out of the sequential frequency order (in contrast to stepping one by one in sequential order through the coarse curves). For example, the selector 58 may start at the coarse curve 0000 and then skip the curves 1000 and 1100 to select curve 1110. This may be considered as selecting the next coarse curve "out of the sequential frequency order" since the next, adjacent coarse curve is not selected. Instead, the next, adjacent coarse curve is skipped to select another, non-adjacent coarse curve configured to be used to produce a higher frequency output signal (in this example). This process thus iterates, via step 708, until the coarse tune engine 46 settles on a final curve. For example, the process may settle on the curve associated with the word 1111. At the selected voltage (i.e., 0.5 volts), the output frequency may be very close to 10 GHz, such as 10.2 GHz. Next, at this point, the system fine tunes the frequency along that selected curve (step 710). To do that, a fine tuner may adjust the input voltage, which is applied to the final VCO 34 having the designated coarse curve code, a certain amount (preferably a small amount) until the frequency of the output voltage signal is 10 GHz. Preferred embodiments iterate steps 704 and 706 two to three times to arrive at the appropriate coarse curve. Moreover, those skilled in the art can have many more or fewer coarse curves. Discussion of four coarse curves is merely to illustrate various embodiments of the invention.

To compare the frequency of the VCO output signal with the desired frequency, various embodiments simply count the leading edge or the trailing edge of the VCO output signal over a prescribed time interval. To improve speed, however, preferred embodiments count both the leading and trailing edges of the VCO output signal. Such a counting method, however, is difficult to implement. To overcome that, the inventors discovered that they could convert the VCO output signal into four out-of-phase signals (e.g., 90 degrees out of phase) representing the VCO output signal, and then count characteristics of those four signals in a more easily implementable manner. These four out-of-phase signals preferably have a lower frequency than that of the output signal from which they derived.

Figure 9:
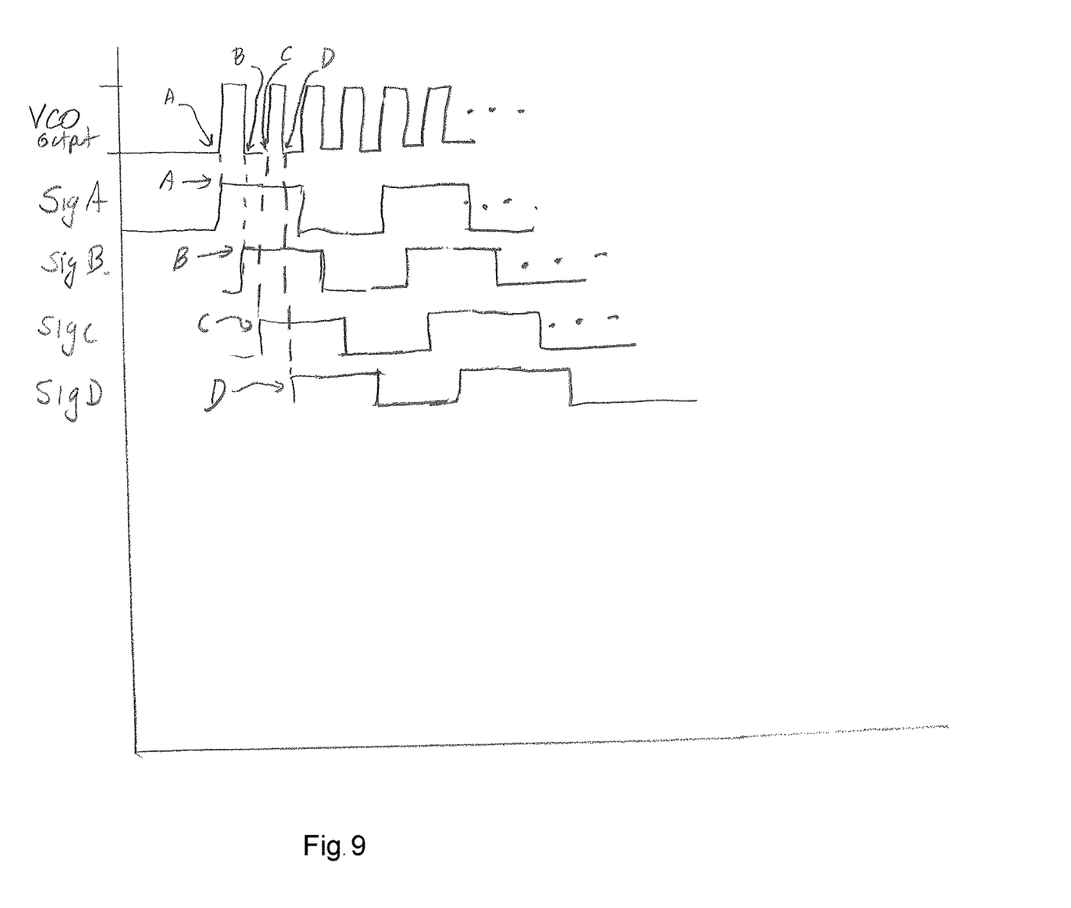
FIG. 9 graphically and schematically shows an exemplary VCO output signal, and four exemplary corresponding phase shifted signals that may be used with illustrative embodiments of the invention.

To that end, FIG. 9 graphically and schematically shows the synthesizer/VCO output signal, and the four noted corresponding signals, which are designated Sig A, Sig B, Sig C, and Sig D. Each of the four signals Sig A-Sig D is phase shifted 90 degrees relative to the signals above and below it. As noted, each signal Sig A-Sig D in this example has a larger period and thus, a lower frequency than the VCO output signal. Illustrative embodiments may form the four signals Sig A-Sig D with conventional interphase quadrature techniques (aka "IQ" techniques) and/or by dividing the VCO output signal by two. As known by those in the art using IQ techniques, a sinusoid with angle modulation can be decomposed into, or synthesized from, two amplitude-modulated sinusoids that are offset in phase by one-quarter cycle (pi/2 radians). All three functions have the same center frequency.

The edges of each of the four signals correspond to alternating leading and trailing edges of the VCO output signal. For example, in FIG. 9, the trailing edge at "A" of signal Sig A corresponds to the trailing edge at A in the VCO output signal. In a complimentary manner, the trailing edge "B" of signal Sig B corresponds to the leading edge B of the VCO output signal. Signals Sig C and D have similar relationships at edges "C" and "D." Accordingly, the coarse tune counter 44 can simply count all four signals Sig A-Sig D in parallel and add up their counts to effectively count both the leading and trailing edges of the VCO output signal. By counting both edges of the VCO output signal, this method efficiently and quickly can arrive at the coarse curve more rapidly than other techniques known by the inventors.

Various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as a pre-configured, stand-along hardware element and/or as preprogrammed hardware elements (e.g., application specific integrated circuits, FPGAs, and digital signal processors), or other related components.

In an alternative embodiment, the disclosed apparatus and methods (e.g., see the various flow charts described above) may be implemented as a computer program product for use with a computer system. Such implementation may include a series of computer instructions fixed either on a tangible, non-transitory medium, such as a computer readable medium (e.g., a diskette, CD-ROM, ROM, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). In fact, some embodiments may be implemented in a software-as-a-service model ("SAAS") or cloud computing model. Of course, some embodiments of the invention may be implemented as a combination of both software (e.g., a computer program product) and hardware. Still other embodiments of the invention are implemented as entirely hardware, or entirely software.

The embodiments of the invention described above are intended to be merely exemplary; numerous variations and modifications will be apparent to those skilled in the art. Such variations and modifications are intended to be within the scope of the present invention as defined by any of the appended claims.

What is claimed is:

1. An apparatus for tuning a frequency synthesizer device toward a prescribed frequency, the apparatus comprising:
   memory for storing a plurality of prescribed coarse curves in a sequential frequency order;
   a selector configured to select a first coarse curve of the set of prescribed coarse curves for producing first output signals having a first output frequency at an output of the frequency synthesizer; and
   a comparator configured to compare the prescribed frequency and the first output frequency to produce a magnitude value,
   the selector further configured to select a second coarse curve of the set of coarse curves as a function of the magnitude value for producing second output signals having a second output frequency at the output of the frequency synthesizer closer than the first output frequency to the prescribed frequency, the selector configured to select the second coarse curve out of the sequential frequency order as a function of the magnitude value.

2. The apparatus of claim 1, wherein the apparatus is configured to perform additional coarse curve selections until a final coarse curve is selected; and
   wherein apparatus further comprises a fine tuner configured to use information from the final coarse curve to fine turn the output signal toward the prescribed frequency.

3. The apparatus of claim 1, wherein the frequency synthesizer includes a switched capacitor bank having a plurality of switches, each of the set of coarse curves being associated with at least one configuration of the plurality of switches.

4. The apparatus of claim 1, wherein the frequency synthesizer comprises a plurality of voltage controlled oscillators;
   wherein the memory is further configured to store a plurality of prescribed coarse curves in a sequential frequency order associated with each of the voltage controlled oscillators.

5. The apparatus of claim 4, wherein the selector is further configured to select one of the plurality of voltage controlled oscillators; and
   wherein the selected first coarse curve and second course curve are associated with the selected voltage controlled oscillator.

6. The apparatus of claim 1 further comprising a counter configured to use the output signal to produce a plurality of phase shifted signals with the same frequencies, the counter also configured to count edges in the plurality of signals to determine the number of rising and falling edges in the output signal, the counter further configured to count one edge per period of each of the plurality of signals, each of the plurality of signals having a lower frequency than the output frequency.

7. A method of tuning a frequency synthesizer device toward a prescribed frequency, the method comprising:
   selecting, from a memory storing a plurality of prescribed coarse curves in a sequential frequency order, a first coarse curve of the set of prescribed coarse curves for producing first output signals having a first output frequency at an output of the frequency synthesizer;
   comparing the prescribed frequency and the first output frequency to produce a magnitude value; and
   selecting a second coarse curve of the set of coarse curves as a function of the magnitude value for producing second output signals having a second output frequency at the output of the frequency synthesizer closer than the first output frequency to the prescribed frequency, wherein the second coarse curve is selected out of the sequential frequency order as a function of the magnitude value.

8. The method of claim 7, wherein selecting the second of the set of coarse curves further comprises selecting a final coarse curve of the set of coarse curves; and
wherein the method further comprising fine tuning, using information from the final coarse curve, the signal towards the prescribed frequency.

9. The method of claim 8 wherein fine tuning comprises after selecting the final coarse curve of the set of coarse curves, varying a given voltage applied to the frequency synthesizer along the final coarse curve to obtain a final signal with the prescribed frequency from the frequency synthesizer device.

10. The method of claim 7, wherein the frequency synthesizer includes a switched capacitor bank having a plurality of switches, each of the set of coarse curves being associated with at least one configuration of the plurality of switches; and
wherein selecting a first coarse curve and selecting a second coarse curve comprise selecting one of the at least one configuration of the plurality of switches.

11. The method of claim 7, wherein the frequency synthesizer comprises a plurality of voltage controlled oscillators; and
wherein the method further comprises selecting one of the voltage controlled oscillators.

12. The method of claim 11, wherein the memory is further configured to store a plurality of prescribed coarse curves in a sequential frequency order associated with each of the voltage controlled oscillators; and
wherein selecting a first coarse curve and selecting a second coarse curve comprising selecting coarse curve associated with the selected voltage controlled oscillator.

13. The method of claim 7 wherein comparing comprises counting one edge of each period of the output signal or counting rising and falling edges of the output signal.

14. A computer program product for use on a computer system for tuning a frequency synthesizer device toward a prescribed frequency, the computer program product comprising a tangible, non-transient computer usable medium having computer readable program code thereon, the computer readable program code comprising:
program code for selecting, from a memory storing a plurality of prescribed coarse curves in a sequential frequency order, a first coarse curve of the set of prescribed coarse curves for producing first output signals having a first output frequency at an output of the frequency synthesizer;
program code for comparing the prescribed frequency and the first output frequency to produce a magnitude value; and
program code for selecting a second coarse curve of the set of coarse curves as a function of the magnitude value for producing second output signals having a second output frequency at the output of the frequency synthesizer closer than the first output frequency to the prescribed frequency, wherein the second coarse curve is selected out of the sequential frequency order as a function of the magnitude value.

15. The computer program product of claim 14, wherein the program code is further configured to perform additional coarse curve selections until a final coarse curve is selected; and
wherein the program code is further configured to use information from the final coarse curve to fine turn the output signal toward the prescribed frequency.

16. The computer program product of claim 14, wherein the frequency synthesizer includes a switched capacitor bank having a plurality of switches, each of the set of coarse curves being associated with at least one configuration of the plurality of switches.

17. The computer program product of claim 14, wherein the frequency synthesizer comprises a plurality of voltage controlled oscillators; and
wherein the memory is further configured to store, for each of the plurality of voltage controlled oscillator, an associated plurality of prescribed coarse curves in a sequential frequency order.

18. The computer program product of claim 17, wherein the program code is further configured to select one of the plurality of voltage controlled oscillators; and
wherein the selected first coarse curve and second course curve are associated with the selected voltage controlled oscillator.

19. The computer program product of claim 14, further comprising program code configured to use the output signal to produce a plurality of phase shifted signals with the same frequencies, and count edges in the plurality of signals to determine the number of rising and falling edges in the output signal;
wherein the program code is further configured to count one edge per period of each of the plurality of signals, each of the plurality of signals having a lower frequency than the output frequency.

* * * * *